United States Patent
Kawaguchi et al.

(10) Patent No.: US 6,469,517 B1
(45) Date of Patent: *Oct. 22, 2002

(54) SORTING METHOD OF MONOLITHIC CERAMIC CAPACITORS BASED ON INSULATION RESISTANCE

(75) Inventors: Yoshio Kawaguchi, Fukui; Yoshikazu Takagi, Sabae; Yasunobu Yoneda, Takefu, all of (JP)

(73) Assignee: Murata Manufacturing Co., Ltd. (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/480,275

(22) Filed: Jan. 11, 2000

Related U.S. Application Data

(63) Continuation-in-part of application No. 09/425,079, filed on Oct. 21, 1999.

(30) Foreign Application Priority Data

Nov. 25, 1998 (JP) .......................................... 10-333621
Jan. 18, 1999 (JP) .......................................... 11-008953

(51) Int. Cl.[7] .................. G01R 31/12; G01R 31/02; H01H 31/12
(52) U.S. Cl. .................. 324/548; 324/551; 324/760; 324/557
(58) Field of Search .................. 324/600, 551, 324/548, 760, 557; 209/574, 573; 361/311, 321.4, 523, 321.5

(56) References Cited

U.S. PATENT DOCUMENTS

| | | | | |
|---|---|---|---|---|
| 3,872,579 A | * | 3/1975 | Papadopoulos | ............. 29/25.03 |
| 4,379,259 A | * | 4/1983 | Varadi et al. | .................. 714/45 |
| 4,465,973 A | * | 8/1984 | Countryman, Jr. | ........... 324/557 |
| 4,467,396 A | * | 8/1984 | Leupold et al. | ........... 361/321.4 |
| 4,583,038 A | * | 4/1986 | Chittick | ........................ 324/548 |
| 4,604,676 A | * | 8/1986 | Senda et al. | ................. 361/309 |
| 4,633,175 A | * | 12/1986 | Ritchie et al. | ............... 324/760 |
| 4,948,759 A | * | 8/1990 | Nair | ............................. 501/17 |
| 4,959,330 A | * | 9/1990 | Donohue et al. | ............... 501/8 |
| 5,059,566 A | * | 10/1991 | Kanai et al. | ................. 501/138 |
| 5,300,824 A | * | 4/1994 | Iyengar | ....................... 327/540 |
| 5,510,719 A | * | 4/1996 | Yamamoto | .................... 324/548 |
| 5,734,545 A | * | 3/1998 | Sano et al. | ............... 361/321.4 |
| 5,790,368 A | * | 8/1998 | Naito et al. | .................. 361/523 |
| 5,790,465 A | * | 8/1998 | Roh et al. | ..................... 365/201 |
| 5,818,686 A | * | 10/1998 | Mizuno et al. | .............. 361/311 |
| 5,841,626 A | * | 11/1998 | Sano et al. | ............... 361/321.5 |
| 6,051,516 A | * | 4/2000 | Mizuno et al. | .............. 501/138 |

FOREIGN PATENT DOCUMENTS

| JP | 7-230939 | | 8/1995 |
|---|---|---|---|
| JP | 409075769 A | * | 3/1997 |

* cited by examiner

*Primary Examiner*—N. Le
*Assistant Examiner*—Wasseem H. Hamdan
(74) *Attorney, Agent, or Firm*—Ostrolenk, Faber, Gerb & Soffen, LLP

(57) ABSTRACT

In the temperature of 70–140 degrees C., the burn-in process of applying a voltage to monolithic ceramic capacitors so that the strength of the electric field applied between the internal electrodes opposing each other may be 7 30 kV/mm is performed. Subsequently, the insulation resistance of the monolithic ceramic capacitor is measured. The monolithic ceramic capacitors are sorted based on the insulation resistance measured during this insulation-resistance measurement process. In this case, it is sufficient to apply the burn-in process for 2–300 seconds.

4 Claims, 1 Drawing Sheet

Figure 1:
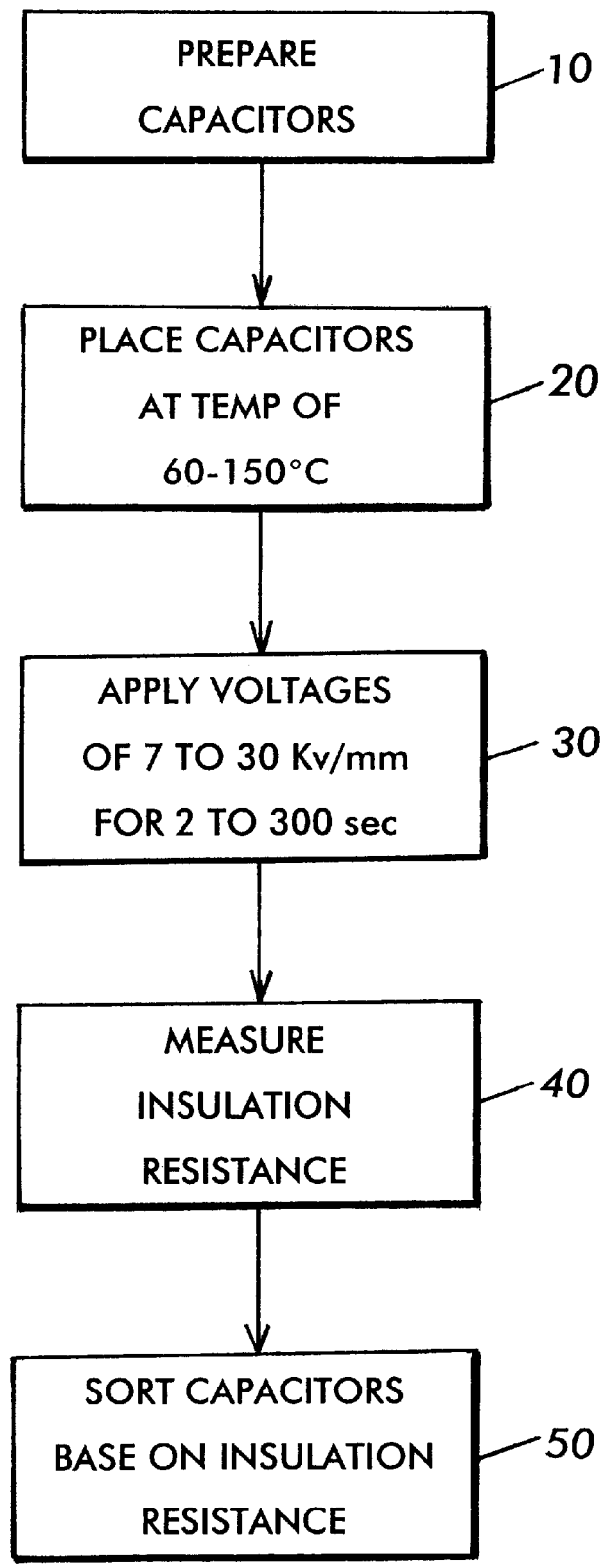

SORTING METHOD OF MONOLITHIC CERAMIC CAPACITORS BASED ON INSULATION RESISTANCE

CROSS-REFERENCE TO RELATED APPLICATIONS

This application is a continuation-in-part application of application Ser. No. 09/425,079, filed Oct. 21, 1999 and entitled "SORTING METHOD OF MONOLITHIC CERAMIC CAPACITORS", the entire disclosure of which is hereby incorporated by reference.

BACKGROUND OF THE INVENTION

The present invention relates to a sorting method of monolithic ceramic capacitors. It is especially related to the improvement for achieving the efficiency of the sorting process, and the improvement in the reliability of the sorting result.

When a foreign substance is mixed or an aggregate is generated in a ceramic dielectric of the monolithic ceramic capacitor during its manufacturing process, such a problem that void regions are caused in the ceramic dielectric after baking may be encountered. Because this defect leads to a degradation of the insulation resistance of the monolithic ceramic capacitor, at a stage before shipment at least, the product having such a defect must be sorted and removed.

In order to sort and remove such defective products, measuring the insulation resistance of the monolithic ceramic capacitors, with providing predetermined conditions in the manufacturing process thereof, is usually performed.

However, the method of measuring the above-mentioned insulation resistance and judging the existence of defect products tends to detect the existence of defect products only indirectly. Therefore, when the defect is on the micro scale, this may be unable to be detected by the indirect method using the evaluation of insulation resistance. In addition, in a certain meaning, it is undetectable by the evaluation of insulation resistance, in other words, the defects on the micro scale with the insulation resistance appearing normal, it may not pose a problem practically either, even when it exists.

However, if thin layering of the dielectric of the monolithic ceramic capacitor progresses, even when it is the micro defect which does not pose a problem practically as mentioned above, the insulation resistance will degrade in long-term usage, and failure by the defect may result. Therefore, implementation of the sorting method whereby a defect is detected with higher reliability is desired as thin layering of dielectric progresses in this way.

Currently, there are many applications of the monolithic ceramic capacitors in military, space, motor vehicle, and the like. In the monolithic ceramic capacitors for these applications, high reliability in sorting result is required. As a method whereby removal of inferior goods and confirmation of quality can be made with high reliability in relation to this, the following U.S. military specification is known.

(1) MIL-STD 39014 item 4.72 "Voltage conditioning" ". . . The double voltage as the rating voltage defined at the maximum allowable working temperature of the capacitor is applied for 96 hours, thereby a defect is made to appear. The subsequent insulation resistance is measured at a normal temperature, and a defect is detected by the degradation of this insulation resistance." This is one of the burn-in process.

(2) MIL-STD 55681C item 3.8 "Insulation-resistance b. at 125 degrees C." ". . . at 125 degrees C., insulation resistance is measured at the rated voltage to confirm that it is a resistance value more than the standard value."

However, there is a problem which should be solved in these defect-detection methods by the U.S. military specification mentioned above.

First, because the conditions exerted on a capacitor are severe according to the method (1) of the above, a reliable evaluation result is obtained. However, in order to obtain such an evaluation result, it requires at least 96 hours, and it is not efficient. Therefore, when all of many monolithic ceramic capacitors must be evaluated, it is not practical.

Next, according to the method (2) of the above, an evaluation can be completed in a comparatively short time. However, about the reliability of the evaluation result, it is not satisfied compared with the method (1).

Consequently, the objective of this invention is to provide an efficient sorting method of the monolithic ceramic capacitors with reliable sorting result.

DETAILED DESCRIPTION OF THE PREFERRED EMBODIMENT(S)

The sorting method of the monolithic ceramic capacitors based on this invention has a characteristic at the burn-in process for making appear the defect which is inherent in the monolithic ceramic capacitor to be sorted. In order to solve the above-mentioned technical problem, at the temperature of 70–140 degrees C., a voltage is applied to the monolithic ceramic capacitor so that the electric field strength applied between the internal electrodes opposing each other may be 7–30 kV/mm. The insulation-resistance measurement process which measures the insulation resistance of the monolithic ceramic capacitor after performing a burn-in process. And, it is made to perform the sorting process which sorts the monolithic ceramic capacitor based on the insulation resistance measured during this insulation-resistance measurement process. A large voltage acceleration property is obtained by providing the above conditions during the burn-in process, and thus reducing the time of sorting.

This invention is especially applied advantageously to the monolithic ceramic capacitor whose thickness of the dielectric layer positioned between the internal electrodes opposing each other is 5 micrometers or less.

Moreover, in this invention, it is sufficient if the burn-in process is performed just for 2–300 seconds.

Moreover, in this invention, the insulation-resistance measurement process is performed, preferably applying the rated voltage of a monolithic ceramic capacitors at a normal temperature.

While explaining this invention in relation to specified examples below, comparative examples performed in order to clarify the effect of this invention is also explained.

First, in step 10, a monolithic ceramic capacitor having 3.2 mm×1.6 mm×1.6 mm dimensions is prepared as a test piece. The electrostatic capacitance is 4.7 micro-F, a rated voltage is 10 V, the thickness of a dielectric layer positioned between the internal electrodes opposing each other is 5 micrometers. In addition, in order to make the comparative evaluation of the example of this invention and the Comparative Example simpler, a lot containing many voids in the ceramic dielectric part was chosen as test pieces.

Next, these test pieces are divided into several groups. The burn-in process explained below was performed on test pieces of each group.

Namely, in steps 20 and 30, while providing each temperature within the limits of 60–150 degrees C. for the monolithic ceramic capacitor based on each test piece, respective voltages are applied to the monolithic ceramic capacitor so that respective electric field strengths might be applied between the internal electrodes. The application time was adapted suitably depending on the size of the electric field strength applied, taking 2 seconds as the lower limit in which the voltage can be controlled stable, while taking 300 seconds which can maintain mass-production property as the upper limit.

Next, in step 40, the insulation resistance of the monolithic ceramic capacitor based on each test piece which have finished the above-mentioned burn-in process was measured. This insulation-resistance measurement process was performed, applying the rated voltage of each monolithic ceramic capacitor, i.e. 10 V, for 60 seconds at a normal temperature.

Next, in step 50, the monolithic ceramic capacitor was sorted based on the insulation resistance measured during the above-mentioned insulation-resistance measurement process. More specifically, the monolithic ceramic capacitors in which the measured insulation resistance was outside the resistance value distribution of normal goods were screened out as inferior goods at the time of sorting.

The ratio of the test pieces judged defective and removed at the sorting process after this insulation-resistance measurement process to the test pieces tested may be determined. Related with this ratio, there is a tendency that, the severer the conditions in a previous burn-in process were, the higher the defective ratio. Therefore, it can be once assumed that the reliability of an evaluation is higher when this defective ratio is high. However, since the test piece used for the burn-in process is mutually different, the defective ratio here does not necessarily reflect reliability of the evaluation.

In order to evaluate the reliability of this evaluation, furthermore, the long-term reliability test which continues applying the voltage of 20 V for 2000 hours to each test piece at 125 degrees C. was performed. And, the insulation resistance after this long-term reliability test is measured, applying the rated-voltage of 10 V at a normal temperature. The products whose measured insulation-resistance value was out of range from the resistance value distribution of normal goods were taken as inferior goods in this reliability test.

Results of the reliability test for certain condition indicates that there was no inferior goods even when performing the above-mentioned long-term reliability test with severe conditions. This shows that the sorting reliability by the sorting method in which the insulation-resistance measurement process is performed after the previous burn-in process is extremely high.

For such a test result, the burn-in process is performed at the temperature of 70–140 degrees C. on the conditions of electric field strength 7–30 kV/mm. Therefore, the voltage acceleration property in this burn-in process is enhanced by choosing the conditions in the burn-in process before the insulation-resistance measurement process. The burn-in process can be finished in a short time, and reliable sorting can be achieved.

On the other hand, in the burn-in process, when the temperature provided is less than 70 degrees C., or the electric field strength applied is 7 kV/mm or less, inferior goods cannot be completely sorted out during the burn-in process, even when the application time of the electric field is selected 300 seconds. Only after a long-term reliability test was performed, it is known that a comparatively large number of the test pieces were inferior goods.

Moreover, in a case where the electric field strength applied exceeds 30 kV/mm or when the temperature provided exceeds 140 degrees C. in the burn-in process, even if the time of applying such an electric field strength is shorten to 2 seconds, the defective ratio exceeding 50% is shown in sorting based on the insulation resistance measured at the insulation-resistance measurement process after the burn-in process. And the result is that the productivity dropped remarkably. It can be assumed that the excessive conditions in such a burn-in process brought about defect or destruction needlessly also for originally excellent articles.

As mentioned above, this invention was explained in relation to the above-mentioned example. However, various modifications are possible within the limits of this invention.

For example, in the above-mentioned example, the thickness of the dielectric layer positioned between the internal electrodes opposing each other for sorting the monolithic ceramic capacitors was 5 micrometers. However, naturally, thickness of the dielectric layer of the monolithic ceramic capacitor to be sorted is not limited to this.

Moreover, in the above-mentioned example, the time of performing burn-in, namely, the duration of applying an electric field between the internal electrodes, was chosen between 2 and 300 seconds. However, this can be changed arbitrarily.

Moreover, in the above-mentioned example, the insulation resistance was measured in the insulation-resistance measurement process, applying the rated voltage of the monolithic ceramic capacitor at normal temperature. However, the conditions of this insulation-resistance measurement process may be changed. For example, the temperature may be changed into the maximum allowable working temperature of the capacitor or to 125 degree-C. degree as in the U.S. military specification mentioned above. Moreover, concerning the measuring voltage, as long as it is in the range which does not destroy the monolithic ceramic capacitor, it may be a voltage exceeding the rated voltage.

As mentioned above, according to this invention, at the temperature of 70–140 degrees C., after performing the burn-in process of applying a voltage to a monolithic ceramic capacitor so that the electric field strength applied between the internal electrodes opposing each other may be 7–30 kV/mm, the insulation resistance of a monolithic ceramic capacitor is measured. Because sorting of the monolithic ceramic capacitors is performed based on the insulation resistance measured during this insulation-resistance measurement process, even if the burn-in process completes in a short time of 2–300 seconds, for example, the defect which is inherent in the monolithic ceramic capacitor can be made appear comparatively reliably. Therefore, a reliable sorting result can be obtained in a short time. Therefore, a large number of monolithic ceramic capacitors can be sorted efficiently.

Since the possibility of failure by this defect after long-term usage is high even if it is a micro defect, when thin layering of the dielectric of a monolithic ceramic capacitor progresses, the sorting method whereby defects are reliably detected with high reliability is desired. Concerning this point, this invention is advantageously applicable especially to the monolithic ceramic capacitor which has a thin dielectric layer of 5 micrometers or less.

Moreover, because according to this invention, the defect which is inherent in a monolithic ceramic capacitor can be made appeared comparatively reliably with the burn-in process as mentioned above, an insulation-resistance measurement process can be performed on the usual conditions of applying the rated voltage of the monolithic ceramic capacitor at normal temperature, and it can prevent the cost of performing the insulation-resistance measurement process from becoming high needlessly.

What is claimed is:

1. A sorting method of monolithic ceramic capacitors, comprising:

a burn-in process of applying a voltage to the monolithic ceramic capacitors so that the strength of the electric field applied between internal electrodes opposing each other at a temperature of 70–40 degrees C. is 7–30 kV/mm, an insulation-resistance measurement process which subsequently measures the insulation resistance of the monolithic ceramic capacitors, a sorting process which sorts the monolithic ceramic capacitors based on the insulation resistance measured in the insulation-resistance measurement process.

2. The sorting method of monolithic ceramic capacitors according to claim 1, wherein the thickness of a dielectric layer positioned between the internal electrodes opposing each other in the monolithic ceramic capacitor is 5 micrometers or less.

3. The sorting method of monolithic ceramic capacitors according to claim 1, wherein the insulation-resistance measurement process is put into effect while applying the rated voltage of the monolithic ceramic capacitor at a normal temperature.

4. A sorting method of monolithic ceramic capacitors, comprising:

a burn-in process of applying a voltage to the monolithic ceramic capacitors so that the strength of the electric field applied between internal electrodes opposing each other at a temperature of 70–40 degrees C. is 7–30 kV/mm, an insulation-resistance measurement process which subsequently measures the insulation resistance of the monolithic ceramic capacitors, a sorting process which sorts the monolithic ceramic capacitors based on the insulation resistance measured in the insulation-resistance measurement process, wherein the thickness of a dielectric layer positioned between the internal electrodes opposing each other in the monolithic ceramic capacitor is 5 micrometers or less and the burn-in process is performed for 2–300 seconds.

* * * * *